United States Patent [19]

Burton

[11] Patent Number: 5,329,178
[45] Date of Patent: Jul. 12, 1994

[54] INTEGRATED CIRCUIT DEVICE WITH USER-PROGRAMMABLE CONDITIONAL POWER-DOWN MEANS

[75] Inventor: Edward A. Burton, Lindon, Utah

[73] Assignee: North American Philips Corporation, New York, N.Y.

[21] Appl. No.: 799,499

[22] Filed: Nov. 27, 1991

[51] Int. Cl.$^5$ .......................................... H03K 19/173
[52] U.S. Cl. .............................. 307/465; 307/296.3; 307/467
[58] Field of Search ................. 307/465, 465.1, 466, 307/467, 468, 469, 296.3; 365/227

[56] References Cited

U.S. PATENT DOCUMENTS

| 4,506,137 | 3/1985 | Yum | 307/466 |
|---|---|---|---|
| 4,532,612 | 7/1985 | Tanaka et al. | 365/227 |
| 4,645,953 | 2/1987 | Wong | 307/466 |
| 4,658,253 | 4/1987 | Johnson | 307/465 |
| 4,801,820 | 1/1989 | Nootbaar | 307/467 |
| 4,918,658 | 4/1990 | Shah et al. | 365/227 |
| 4,959,564 | 9/1990 | Steele | 307/465 |
| 5,045,717 | 9/1991 | Moen | 365/227 |

FOREIGN PATENT DOCUMENTS 337676 10/1989 European Pat. Off. .
52-137228 11/1977 Japan .
52-137229 11/1977 Japan .

OTHER PUBLICATIONS

80C51 Family Hardware Description, 80C51 and Derivative Microcontrollers, Data Handbook, Signetics/-Phillips, 1991, pp. 38–39.

Primary Examiner—Edward P. Westin
Assistant Examiner—Andrew Sanders
Attorney, Agent, or Firm—Bernard Franzblau

[57] ABSTRACT

An integrated circuit device is provided with user-programmable power-down means for disabling a particular circuit in the device under control of a user-specified state of an input signal supplied to the device. In particular, for PLDs a power-down feature of this kind is simple to implement, requiring no additional I/O pins on the device, considerably reduces power consumption and renders the device more versatile than prior art devices.

18 Claims, 2 Drawing Sheets

INTEGRATED CIRCUIT DEVICE WITH USER-PROGRAMMABLE CONDITIONAL POWER-DOWN MEANS

FIELD OF THE INVENTION

This invention relates to an integrated circuit device that comprises a circuit and power-down means for reversibly disabling the circuit.

BACKGROUND ART

Power-down means in integrated circuit devices is a feature for reducing an item such as power consumption or electro-magnetic radiation by disabling the circuit in the device. The circuit is kept disabled as long as a pre-determined power-down condition prevails. When the power-down condition is removed, the circuit is re-enabled.

For example, a memory circuit chip powers down when the CE signal (chip enable) is negated and powers back up again when the CE signal is reasserted. Toshiba MOS Memory Products 1989 Databook, page D.3, shows a memory chip that is powered down in response to a fixed combination of values of $CE_1$ and $CE_2$ signals. Note that the prior art shows a predetermined character of the input signals required to trigger the powering down of the circuit. This predetermined character or fixed combination is built into the device during manufacturing.

OBJECT OF THE INVENTION

It is therefore an object of the invention to provide an integrated circuit device with power-down means that renders the device of the invention more versatile and more user-friendly than prior art integrated circuit devices.

SUMMARY OF THE INVENTION

To this end, the invention provides an integrated circuit device comprising a circuit and power-down means for disabling the circuit. The power-down means is user-programmable for reversibly disabling the circuit under control of a user-programmed state of at least one input signal supplied to the device.

Accordingly, the user introduces into the device the conditions for powering down the circuit by means of programming the power-down means. For example, in a logic environment the user may program the power-down means to be responsive to a logic high input signal or to a logic low signal. In case there is a plurality of input signals available, the user has the option to program the power-down means to be responsive to a specific combination of logic highs, logic lows, and "don't cares". In addition the user may program the power-down means to disable the circuit in response to input signals that also are supplied to the circuit, output signals provided by the circuit, input signals that have their origin elsewhere, or to input signals that are a combination thereof.

This architecture is of particular interest to programmable logic devices as is explained below.

BRIEF DESCRIPTION OF THE DRAWING

The invention is explained below by way of example and with reference to the drawing, wherein.

DETAILED DESCRIPTION OF THE EMBODIMENTS

General Diagram

Figure 1:
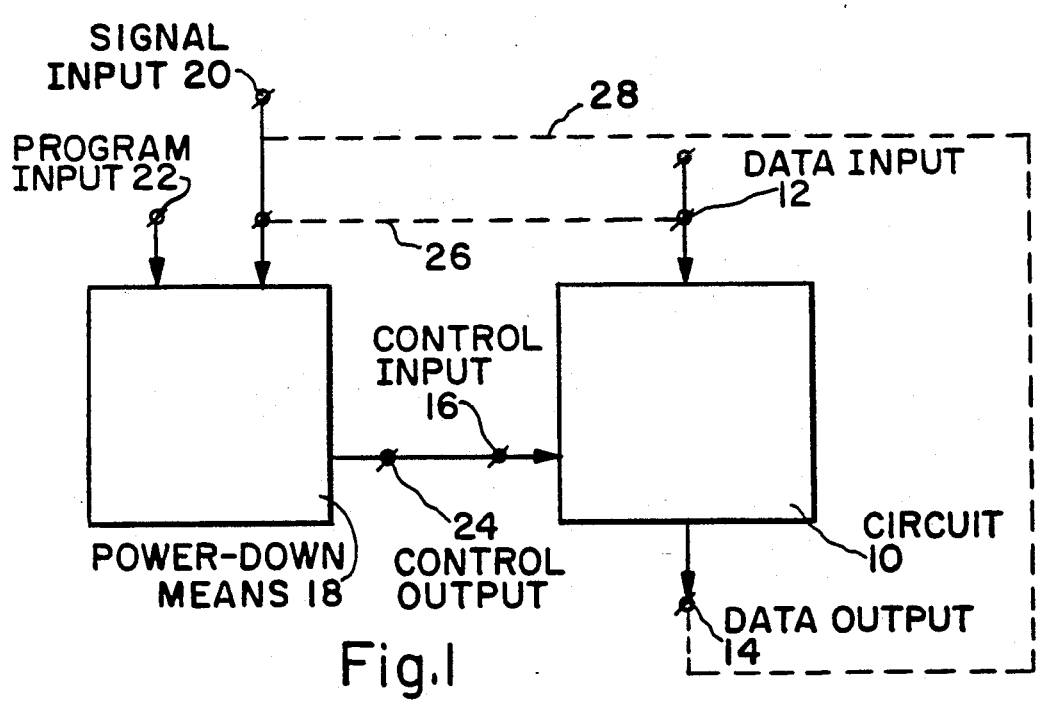
FIG. 1 shows a general diagram of an integrated device according to the invention.

FIG. 1 shows a block diagram of an integrated circuit device of the invention. The device comprises a circuit 10 that has a data input 12 for receiving a first data input signal, and a data output 14 for supplying a data output signal. The circuit further has a power-down control input 16. A control signal supplied to control input 16 results in circuit 10 being disabled. The device further comprises power-down means 18. Power-down means 18 has a signal input 20 for receiving a second input signal, and a program input 22 for receiving a program signal for programming power-down means 18. Power-down means 18 has a control output 24 connected to control input 16.

Power-down means 18 is programmed via program input 22 by means of applying a program signal. The character of the program signal determines a particular state, e.g. logic state, of power-down means 18. Once programmed, power-down means 18 is responsive only to a second input signal having a specified state at input 20. That is, the combination of the programmed particular state and the specified state of the second input signal determines whether or not power-down means 18 disables circuit 10 via control input 16. Power-down means 18 may be programmable by blowing one or more fuses or anti-fuses. Alternatively, power-down means may be reprogrammable by employing a reprogrammable memory element, such as an EEPROM cell, an SRAM cell or a DRAM cell.

Power-down means 18 may be controllable by a plurality of second input signals received at input 20. In a logic circuitry environment, for instance, the user may prescribe the second input signals supplied to power-down means 18 to be a specific combination of logic highs, logic lows and "don't care's" to activate power-down means 18.

Disablement of circuit 10 may occur in a variety of ways, for instance, by disconnecting circuit 10 from its power supply (not shown). Alternatively, circuit 10 may be set into a predetermined state, wherein circuit 10 is not susceptible to input signals at data input 12. In this latter option, circuit 10 is put into, for instance, a stand-by state wherein it is supplied with a current that is high enough to retain data stored in a volatile memory (not shown) in circuit 10 and low enough to render data processing parts inoperative. In still another embodiment, input signals at data input 12 are blocked, thus preventing circuit 10 from operating on these input signals, circuit 10 thereby adopting a non-operating state.

Dashed line 26 between data input 12 and signal input 20 indicates that circuit 10 and program means 18 may receive, entirely or partially, the same input signals. That is, at least some of the first data input signals supplied to data input 12 may be identical to at least some of the second input signals supplied to signal input 20.

Dashed line 28 indicates that data output 14 may provide data output signals to signal input 20. The combination of signals that originate in circuit 10 and signals that are received at signal input 20 from outside circuit 10 thus control power-down means 18. In this case, the data output signals from circuit 10 may be furnished via, e. g., a macro (not shown). A macro is well known in the art as a user-programmable signal-configuration block. By means of programming the macro, the user specifies if, for example, the data output signals at data output 14 are to be latched, inverted, logically combined, or toggled under clock control. The macro retains the data output signals when the circuit is powered down. This architecture may be implemented in BiCMOS-type devices, using bipolar transistors for the circuit (e.g., PLD) to be powered down (and up again) and FETs of mutually complementary conductivity types for the macro.

PLD Block Diagram

Although applicable to a wide range of functionally different integrated circuits, the invention has particular advantages in the field of PLDs. Generally, a PLD comprises a large number of selectively programmable logic gates that enable the user to implement a wide variety of Boolean functions operating on input signals.

According to the invention, one or more specified logic gates in a PLD are reserved to control the powering down of entire logic gate sections in the PLD upon receiving a particular input signal or a particular combination of input signals. Conditions that determine the specified gates to be activated are readily implemented by means of programming the specified gates in the usual way.

PLDs based on wired logic especially benefit from this architecture. As known, wired logic circuitry operates very fast at the expense of high power consumption. The power-down means in the invention controls the power consumption in a user-specified way. Accordingly, wired logic PLDs in accordance with the invention are rendered suitable for application in portable, battery powered electronic devices, such as lap top computers.

PLDs form essential generic building blocks for almost any kind of electronic data processing system. Therefore, implementing a system using these highly versatile devices of the invention provides the system designer with more degrees of freedom to tailor the system with respect to speed and power consumption requirements.

Figure 2:
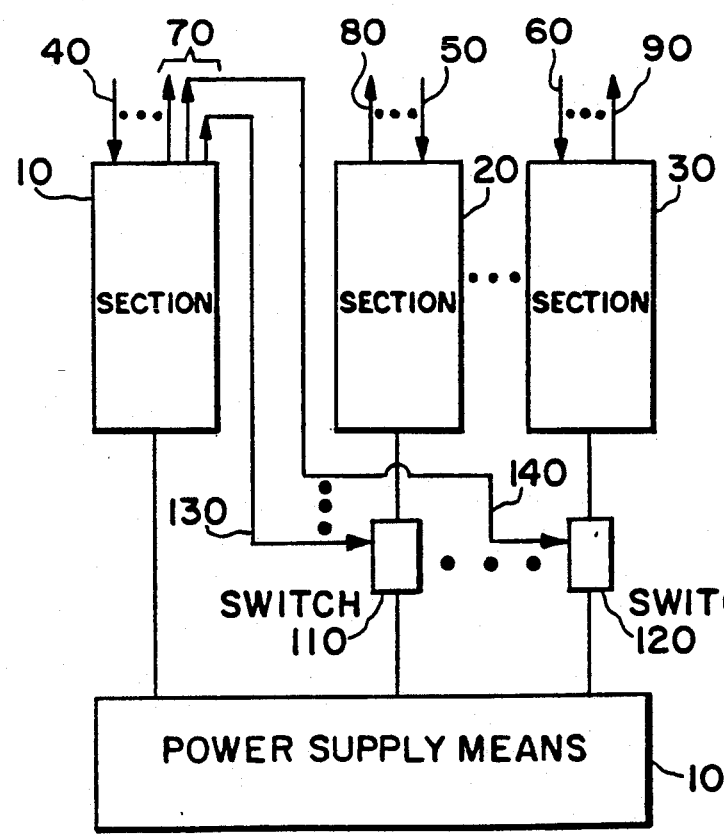
FIGS. 2 and 3 illustrate the invention as related to PLDs.

FIG. 2 shows an example of a PLD according to the invention. The PLD comprises programmable logic gates (not shown) that are functionally arranged in logic gate sections 10, 20 and 30. Logic gate sections 10-30 have inputs 40, 50 and 60 for receiving input signals and outputs 70, 80 and 90 for supplying output signals. Logic gate sections 10-30 are powered by power supply means 100. Section 10 is directly connected to power supply means 100, whereas sections 20 and 30 are coupled to power supply means 100 via switches 110 and 120, respectively. Section 10 controls switches 110 and 120 via specified outputs 130 and 140 respectively.

The logic gates of sections 10-30 are programmed by the user in the ordinary manner. The programmed state of one or more specified logic gates in section 10 determines how input signals at input 40 control output signals at specified outputs 130 and 140. That is, if input signals at input 40 are of a predetermined logic value imposed by the programmed state of the specified logic gates, switches 110 and 120 are activated.

Due to the fact that the specified logic gates of section 10 are already integral parts of the PLD device, only a very small number of electronic elements is required in addition to the conventionally available ones in order to enhance the PLD's applicability. More particularly, adding only switches 110-120 and the interconnecting leads between them and specified outputs 130-140 creates the user-programmable power-down features. Note that this architecture does not require either additional I/O pins nor a change in function of the conventionally available I/O pins in the integrated circuit device.

Alternatively, the specified logic gates may be added to the conventional PLD circuitry together with switches 110-120. This approach retains the traditional functional organization of the programmable logic gates and keeps the selection mechanism for selecting the logic gates, other than the specified ones, during programming well organized.

Section 10 may comprise a single logic gate, whereas each of the sections 20-30 may comprise a large number of logic gates. Organizing the logic gates in such a way that in each section 20-30 all gates but one in each of the sections 20-30 is another design option with the advantage that outputs 40-60 are still controllable in a limited way, for instance to set outputs 40-60 in a predetermined logic state. The PLD may be designed to disable sections 20-30 simultaneously or independently from one another.

Transistor Diagram PLD

Figure 3:
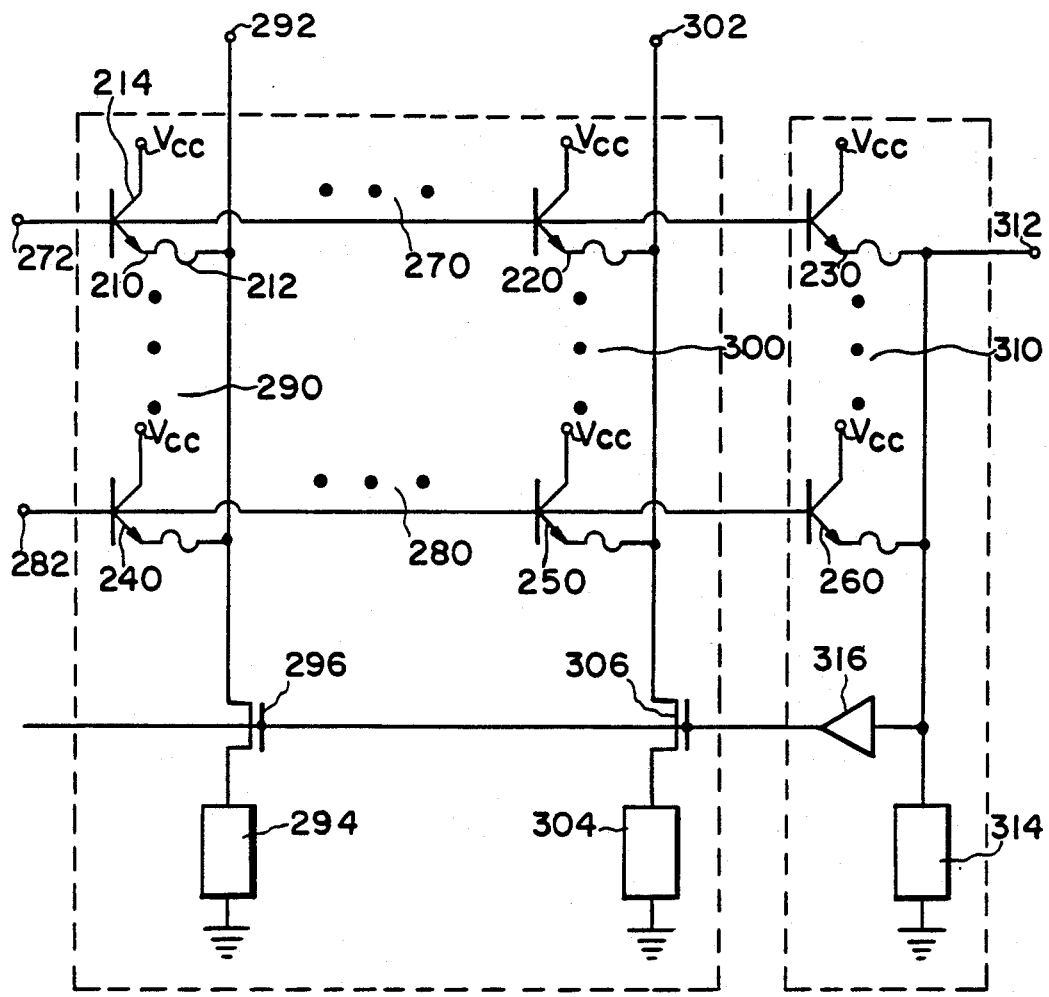

FIG. 3 gives a transistor diagram of an example for a logic gate section for use in a PLD of the invention. The section comprises programmable cells 210, 220, 230, 240, 250 and 260 functionally organized in rows 270 and 280 and columns 290, 300 and 310. Cell 210 is of a known type and has a fuse 212 and an npn transistor 214 arranged in series between supply voltage Vcc and an output 292 of column 290. Transistor 214 has a base electrode connected to a row input 272 of row 270. Cells 220-260 comprise identical fuses and transistors similarly arranged between the relevant ones of row inputs 272 and 282, and the relevant ones of column outputs 292, 302 and 312. Column outputs 292-302 are connected to pull-down means 294 and 304, respectively, through the main current path of FETs 296 and 306, respectively. The column output 312 is connected to pull-down means 314.

The architecture of the section in FIG. 3 is an example of wired logic. For instance, if an input signal at one of inputs 272-282 is considered to be logic HIGH or logic LOW when an input voltage associated with the signal is substantially Vcc or ground, respectively, then the section represents a wired-OR function. Alternatively, if a logic HIGH and a logic LOW corresponds to ground and Vcc, respectively, then a wired-AND function is implemented. Note that in general a plurality of pairs of mutually complementary logic input signals is employed to operate a PLD. Programming the PLD is accomplished by selectively blowing the fuses in the usual way, thereby rendering the PLD unsusceptible to switching of selected ones among the input signals.

Column 310 functions as a power-down means for deactivating columns 290-300. Upon reception of a particular pattern of input signals at inputs 272-282, output 312 supplies a specified output voltage associated with the pattern. The output voltage is applied to an element 316 that thereupon supplies a control signal to FETs 296-306. Depending on the logic operation performed on this output voltage by element 316, FETs 296-306 are turned on or turned off, thereby enabling or disabling, respectively, columns 290-300. As long as the particular pattern prevails, this status is maintained.

Pull-down means 294-314 each comprise, for instance, a respective resistor or a respective active current source, such as a respective output current branch of a multiple-output current mirror. Element 316 comprises, for example, an inverter or a non-inverting buffer, depending on the logic polarity used and the polarity type of FETs 296-306. Column 310 may control more than one section of logical gates, for instance all sections in the PLD. As is known in the art, the array of logic gates shown in FIG. 3 may be physically integrated with another array of logic gates (not shown) in order to implement an AND-OR plane.

Element 314 itself may be a part that can be programmed or permanently disabled, for instance, by blowing a fuse. This offers the opportunity to operate the section as a conventional logic array in response to all possible patterns of input signals. In this way, a first portion of the PLD may be selected to be handled traditionally, whereas another portion may be alternately disabled or enabled in response to the input signals.

I claim:

1. An integrated circuit device comprising; a circuit and power-down means for disabling the circuit, wherein the power-down means is user-programmable for reversibly disabling the circuit under control of a user-specified state of at least one input signal which is supplied to both the power-down means and the circuit.

2. An integrated circuit device comprising, a circuit and power-down means for disabling the circuit, wherein the power-down means is operative to reversibly disable the circuit in response to at least one input signal supplied to the power-down means, and wherein the power-down means is user-programmable such that its response to a specific state of the input signal is specified by the user of the device.

3. The device of claim 2 wherein the circuit is disabled under control of a user-programmed combination of a plurality of input signals supplied to the power-down means.

4. An integrated circuit device comprising a circuit and power-down means for disabling the circuit, wherein the power-down means is user-programmable for reversibly disabling the circuit under control of a user-specified state of at least one input signal supplied to the power-down means wherein the circuit is disabled under control of a user-programmed combination of a plurality of input signals supplied to the power-down means and the power-down means is programmable to disable the circuit under control of a least one input signal among the plurality of input signals, said one input signal being an output signal from the circuit.

5. An integrated circuit device comprising a circuit and power-down means for disabling the circuit, wherein the power-down means is user-programmable for reversibly disabling the circuit under control of a user-specified state of at least one input signal supplied to the power-down means, wherein the circuit is disabled under control of a user-programmed combination of a plurality of input signals supplied to the power-down means and the power-down means is programmable to disable the circuit under control of a least one input signal among the plurality of input signals, said one input signal being a further input signal supplied to the circuit.

6. An integrated circuit device comprising a circuit and power-down means for disabling the circuit, wherein the power-down means is user-programmable for reversibly disabling the circuit under control of a user-specified state of at least one input signal supplied to the power-down means, wherein the circuit is disabled under control of a user-programmed combination of a plurality of input signals supplied to the power-down means and the power-down means is programmable to disable the circuit under combined control of at least a first one among the plurality of input signals and which is an output signal from the circuit, and at least a second one among the plurality of input signals and which is a further input signal supplied to the circuit.

7. The device of claim 4 wherein the power-down means is programmable to disable the circuit under control of at least another one among the plurality of input signals and which is provided via an externally accessible input of the device.

8. The device of claim 5 wherein the power-down means is programmable to disable the circuit under control of at least another one among the plurality of input signals and which is provided via an externally accessible input of the device.

9. The device of claim 2 wherein the user-specified state of the input signal is selected to be one of the following; a logic high and a logic low.

10. The device of claim 4 wherein the user-specified state of each of the plurality of input signals is selected to be one of the following; a logic high, a logic low and irrelevant.

11. The device of claim 2 wherein the circuit comprises;
an array of first programmable logic gates; and wherein the power-down means comprises;
a second programmable logic gate.

12. The device of claim 2 wherein the circuit comprises;
a plurality of arrays of first programmable logic gates; and wherein the power-down means comprises;
a second programmable logic gate for powering down the arrays of first logic gates in parallel.

13. The device of claim 2 wherein the circuit comprises;
a first plurality of arrays of first programmable logic gates;
and wherein the power-down means comprises;
a second plurality of second programmable logic gates, each for powering down selective ones among the arrays of first logic gates.

14. The device of claim 2 wherein the power-down means is programmable to be deactivated.

15. The device of claim 2 wherein the circuit is disabled by means for disconnecting the circuit from a power supply.

16. The circuit of claim 2 wherein the power-down means are re-programmable.

17. A programmable logic device comprising, a plurality of inputs to receive a plurality of input signals, programmable logic circuitry to perform a logic operation on the input signals for producing an output signal, and power-down means connected to one or more specific ones of the inputs for powering down at least a portion of the programmable circuit in response to one or more specific ones of the input signals, the power-down means being user-programmable as to its response to a particular state of the specific input signals.

18. A device as claimed in claim 2 wherein the circuit comprises;
an array of first programmable logic gates;
and wherein the power-down means comprises;
a second programmable logic gate for powering down said array of first programmable logic gates by disconnecting said array from its power supply.

* * * * *